(12) United States Patent
Gogoi

(10) Patent No.: US 7,122,395 B2
(45) Date of Patent: Oct. 17, 2006

(54) METHOD OF FORMING SEMICONDUCTOR DEVICES THROUGH EPITAXY

(75) Inventor: Bishnu Gogoi, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 26 days.

(21) Appl. No.: 10/328,922

(22) Filed: Dec. 23, 2002

(65) Prior Publication Data

US 2004/0121564 A1    Jun. 24, 2004

(51) Int. Cl.
*H01L 21/00* (2006.01)

(52) U.S. Cl. .............................. 438/48; 438/50; 438/52

(58) Field of Classification Search ........... 438/48–553
See application file for complete search history.

(56) References Cited

U.S. PATENT DOCUMENTS

| | | | |
|---|---|---|---|
| 5,258,097 A | 11/1993 | Mastrangelo | 156/644 |
| 5,294,556 A * | 3/1994 | Kawamura | 438/481 |
| 5,310,450 A | 5/1994 | Offenberg et al. | 156/630 |
| 5,576,250 A | 11/1996 | Diem et al. | 437/228 |
| 5,616,514 A | 4/1997 | Mulchow et al. | 438/50 |
| 5,616,523 A | 4/1997 | Benz et al. | 438/50 |
| 5,750,420 A | 5/1998 | Bono et al. | 428/52 |
| 5,937,275 A | 8/1999 | Munzel et al. | 438/50 |
| 5,959,208 A | 9/1999 | Muenzel et al. | 73/514.32 |
| 6,030,850 A | 2/2000 | Kurle et al. | 438/48 |
| 6,055,858 A | 5/2000 | Muenzel et al. | 73/504.12 |
| 6,401,536 B1 | 6/2002 | O'Brien | 73/514.38 |
| 6,413,793 B1 * | 7/2002 | Lin et al. | 438/50 |

OTHER PUBLICATIONS

U.S. Appl. No. 10/238,062, filed Sep. 9, 2002, O'Brien et al.

Ishihara K., Yung C.-F., Ayon A.A., Schmidt M.A. "An inertial sensor technology using DRIE and wafer bonding with interconnecting capability" IEEE/ASME J. Microelectromech. Syst. 8, 403-408 (1999).

James M. Bustillo, Robert T. Howe, "Surface Micromachining for Microelectromechanical Systems", Proceedings of the IEEE, vol. 86, No. 8 (Aug. 1998).

* cited by examiner

*Primary Examiner*—H. Jey Tsai
(74) *Attorney, Agent, or Firm*—John A. Fortkort; Fortkort & Houston P.C.

(57) ABSTRACT

A method for creating a semiconductor structure is provided. In accordance with the method, a semiconductor substrate (101) is provided over which is disposed a sacrificial layer (103), and which has a thin single crystal semiconductor layer (105) disposed over the sacrificial layer (103). An opening (107) is then created which extends through the semiconductor layer (105) and into the sacrificial layer (103). The semiconductor layer (105) is then epitaxially grown to a suitable device thickness, thereby resulting in a device layer. The semiconductor layer is grown such that the resulting device layer extends over the opening (107), and such that the surface of the portion of the device layer extending over the opening is single crystal silicon.

28 Claims, 3 Drawing Sheets

METHOD OF FORMING SEMICONDUCTOR DEVICES THROUGH EPITAXY

FIELD OF THE INVENTION

The present invention relates generally to microfabrication techniques, and more particularly to methods for making MEMS devices.

BACKGROUND OF THE INVENTION

Advancements in micromachining and other microfabrication techniques and processes have enabled the fabrication of a wide variety of MicroElectroMechanical Systems (MEMS) and devices. These include moving rotors, gears, switches, accelerometers, miniaturized sensors, actuator systems, and other such structures.

One popular approach for forming MEMS devices makes use of a modified wafer known as a Silicon-On-Insulator (SOI) wafer. An SOI wafer is essentially a silicon wafer having a silicon dioxide sacrificial layer disposed thereon, and having a film of active single-crystalline silicon disposed on the sacrificial layer.

MEMS devices fabricated on SOI wafers have a number of advantages. The formation of a MEMS device on such a wafer occurs in single crystal silicon that is of very high mechanical quality. Consequently, the components of the device can be made with high thickness and have inherently low mechanical stress. Moreover, because the components of the device are fabricated from single crystal silicon, the device can be readily integrated with CMOS devices and other such structures.

In the processing of a MEMS device, it is often necessary to make electrical contact to the handle wafer which provides support for the MEMS structures. One method of doing so involves the use of a thin epitaxial layer to selectively etch away the device layer and sacrificial layer. The device silicon can then be grown to the required thickness on the exposed substrate. However, this approach typically results in a non-planar surface as a result of defect propagation during epitaxial growth. A non-planar surface is undesirable because the fine line lithography commonly used to develop surface features on the device has limited depth focus.

Another problem encountered during the fabrication and use of MEMS devices relates to stiction. Stiction refers to the phenomenon in which a moving component of a MEMS device adheres to an adjacent surface. Stiction typically occurs when surface adhesion forces between the component and the adjacent surface are higher than the mechanical restoring force of the micro-structure. These surface adhesion forces may arise from capillary forces, electrostatic attraction, or direct chemical bonding. In MEMS devices such as accelerometers, it is imperative that the fingers of the device are not subject to vertical stiction, since this can cause the device to malfunction. Unfortunately, stiction becomes increasingly problematic as device sizes are reduced, and hence it has become a greater obstacle to overcome as MEMS devices have become more sensitive.

One approach to preventing stiction is through the formation of anti-stiction protrusions on SOI wafers. A known method for making anti-stiction protrusions involves a wafer comprising a silicon substrate, a silicon oxide sacrificial layer and a silicon device layer. A series of trenches are etched in the device silicon to expose the sacrificial layer. The sacrificial layer is then laterally etched with hydrofluoric acid (which does not etch silicon) until one or more thin portions of the sacrificial layer remain. Then, the device silicon and silicon substrate are isotropically etched with a solution of KOH. Since the KOH does not attack the material of the sacrificial layer, the remaining portion of the sacrificial layer acts as a mask to the silicon underneath it. Hence, protrusions are formed where the remaining portion of the sacrificial layer attaches to the device layer and to the substrate. The etch of the sacrificial layer may then be completed, leaving behind a series of protrusions on the opposing surfaces of the substrate and the device layer. While this method can be reasonably effective at forming anti-stiction protrusions, process variations in the wet etch steps frequently result in inconsistent protrusion or device thickness, and consequent variations in device performance.

There is thus a need in the art for a method for producing a MEMS structure on a substrate, and particularly on an SOI wafer, that allows for a high degree of surface planarity on the wafer after electrical contact to the handle wafer has been made. There is also a need in the art for a method for producing anti-stiction protrusions in a MEMS structure that achieves a consistent device thickness. These and other needs are met by the methodologies and devices disclosed herein and hereinafter described.

SUMMARY OF THE INVENTION

In one aspect, a method is provided herein for creating a semiconductor structure. In accordance with the method, a semiconductor substrate is provided which has disposed thereon a sacrificial layer, and which has a semiconductor device layer disposed over the sacrificial layer. An opening is then created which extends through the device layer and into the sacrificial layer. The opening may extend only partially through the sacrificial layer, or may extend completely through the sacrificial layer and expose a portion of the substrate. The device layer is then epitaxially grown to a suitable device thickness such that the opening is covered by the material of the device layer and such that the surface of the device layer is essentially smooth. Preferably, the device layer is grown such that the opening is filled by the material of the device layer. The step of epitaxially growing the device layer may be used to form an anchor portion which is in contact with the substrate and which extends through the sacrificial layer, or it may be used to form an anti-stiction protrusion which is in contact with said device layer.

In another aspect, a method is provided herein for creating a semiconductor structure. In accordance with the method, an article is provided which comprises a substrate and a semiconductor layer and which has a sacrificial layer disposed between the substrate and the semiconductor layer. At least one opening is created in the article which extends through the semiconductor layer and the sacrificial layer and exposes a portion of the substrate. The device layer is then epitaxially grown such that the resulting layer is essentially planar and such that an anchor portion results which is in contact with the substrate and which extends through the sacrificial layer. The step of epitaxially growing the semiconductor layer may involve both lateral and vertical epitaxial growth of the semiconductor layer in the opening. A semiconductor structure is then formed in the semiconductor layer, and at least a portion of the sacrificial layer is removed with an etchant, such as an aqueous HF solution, thereby releasing the structure. Preferably, the ratio of the depth of the opening to the thickness of the device layer is within the range of about 1 to about 10, more preferably within the range of about 2 to about 5, and most preferably within the range of about 3 to about 4.

In yet another aspect, a method for creating a semiconductor structure having an anti-stiction protrusion is provided. In accordance with the method, an article is provided which comprises a substrate and a semiconductor layer and which has a sacrificial layer disposed between the substrate and the semiconductor layer. At least one opening is created in the article which extends through the semiconductor layer and partially into the sacrificial layer. The semiconductor layer is then epitaxially grown to form a device layer such that the material of the device layer extends into the opening and thereby forms a protrusion that protrudes from the device layer. The step of epitaxially growing the semiconductor layer may involve both lateral and vertical epitaxial growth of the semiconductor layer in the opening. A semiconductor structure is then formed in the semiconductor layer, and at least a portion of the sacrificial layer containing the protrusion is removed with an etchant. The ratio of the depth of the opening to the thickness of the device layer is preferably sufficiently small such that the device layer has a substantially planar surface. Preferably, the ratio of the depth of the opening to the thickness of the device layer is within the range of about 1 to about 10, more preferably within the range of about 2 to about 5, and most preferably within the range of about 3 to about 4.

These and other aspects are described in further detail below.

DETAILED DESCRIPTION

Figure 1:
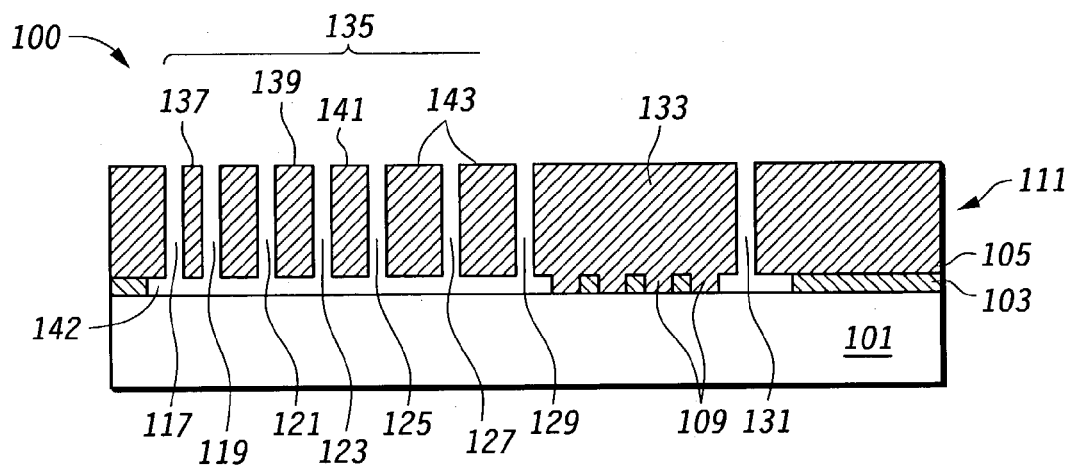
FIG. 1 is a cross-sectional illustration of a MEMS structure with contact to the handle wafer.

It has now been discovered that the above noted and seemingly disparate problems can be solved through the use of merged lateral overgrowth of epitaxial silicon to make electrical contact to the handle wafer and to create anti-stiction protrusions. In particular, it has been found that MEMS structures with electrical contact to the substrate and having a high degree of surface planarity may be fabricated on SOI wafers and other substrates by utilizing merged lateral overgrowth of epitaxial silicon. In this method, the starting wafer is a silicon handle wafer with a thick sacrificial layer and a thin single crystal semiconductor layer (typically about 0.1 to about 0.5 microns thick) disposed thereon. The semiconductor layer is patterned with small openings. The semiconductor layer and sacrificial layer are then etched down to the handle silicon in these openings, after which the semiconductor layer is grown to the desired device thickness in an epitaxial reactor. During the growth process, the silicon grows vertically as well as laterally in and over the openings and merges to form a planar layer which then continues to grow with a planar topography. Thus, through appropriate selection of the dimensions of the openings in the semiconductor layer, lateral overgrowth and vertical overgrowth can be made to proceed such that, at the end of epitaxy, the resulting wafer is highly planar and is suitable for fine line lithography.

The dimensions of the openings in the semiconductor layer may be chosen, for example, in consideration of the desired thickness of the device layer, the lateral epitaxial growth rate, and the thickness of the sacrificial layer so that a highly planar surface will result. Preferably, the ratio of the depth of the opening to final device layer thickness is within the range of about 1 to about 10, more preferably about 2 to about 5, and most preferably from about 3 to about 4. Also, the ratio of the minimum width of the opening to final device layer thickness is preferably within the range of about 0.05 to about 2, and more preferably about 0.1 to about 1.3.

By comparison, in a typical prior art device, the dimensions of the openings to the substrate are large compared to the thickness of the device layer. Consequently, to the extent that lateral overgrowth and vertical overgrowth could be made to occur in the methodologies used to make such prior art devices, it would not typically result in a device layer that is sufficiently planar so as to be suitable for fine line lithography. Moreover, the distance between the epitaxial fronts in such devices gives rise to the formation of defects at the edges of the openings, which again adversely affects the planarity of the epitaxial surface.

It has also been found that merged lateral overgrowth of epitaxial silicon and epitaxial polysilicon can be used to form anti-stiction protrusions in MEMS devices, without the variations in device layer thickness that typically accompany conventional methods that rely on isotropic silicon etching. In this application of merged lateral overgrowth, the starting wafer is typically a silicon handle wafer with a thick sacrificial layer and a thin single crystal semiconductor layer (typically about 0.1 to about 0.5 microns thick) disposed thereon. The semiconductor layer is patterned and etched in the areas where the protrusions need to be formed to form a series of individual regularly spaced small openings. The sacrificial layer is then partially etched. Thus, for example, if the overall thickness of the sacrificial layer is about 1 micron, the partial etch may be to a depth of about 0.3 to about 0.5 microns. When the semiconductor layer is subsequently grown to the desired device thickness by epitaxy, the small openings are filled up due to lateral epitaxial growth of silicon as well as the vertical and lateral growth of epitaxial polysilicon from where the sacrificial oxide is exposed, thus resulting in the formation of the anti-stiction protrusions. After release of the structure, when the sacrificial layer is removed from around the protrusions, the anti-stiction protrusions prevent vertical stiction of the mechanically flexible elements of the MEMS device.

The methodologies described herein may be understood with reference to FIGS. 1–5 and FIGS. 6–10. The devices depicted in these figures are hypothetical MEMS devices, the relevant features of which have been consolidated into a single cross-section so that the effect of each processing step on these features will be evident from a single figure. It is to be understood, however, that in an actual MEMS device, these features may not all appear in any single cross-section of the device. This point may be further appreciated with reference to FIG. 11, which illustrates a design for an actual MEMS device that may be made in accordance with the methodologies described herein.

FIG. 1 illustrates one embodiment of a MEMS device 100 that can be made using merged lateral overgrowth of epitaxial silicon to form an electrical contact to the handle wafer. The device is created on a substrate comprising a silicon handle wafer 101 and a sacrificial layer 103, and has an anchor portion 133 and a suspended portion 135. The anchor portion in the particular device depicted is equipped with a plurality of anchors 109 that make electrical contact to the handle wafer 101. The device has an epitaxially grown device layer 111, and is equipped with a proof mass area 143, at least one moving finger 139, at least one fixed finger 141, and a spring suspension 137. Release of the structure is accomplished through the creation of horizontal trench 142 via vertical trenches 117, 119, 121, 123, 125, 127, 129 and 131.

Figure 2:
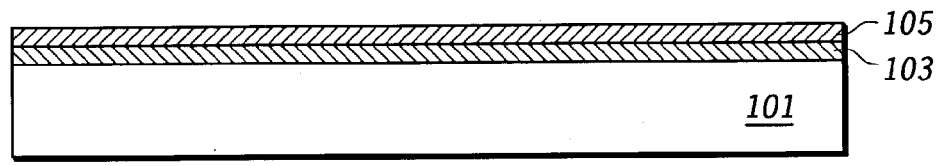
FIGS. 2–5 are cross-sectional illustrations depicting an embodiment of the methodology that may be used to fabricate the device of FIG. 1.

FIGS. 2–5 illustrate the methodology that may be used to achieve the structure depicted in FIG. 1. As shown in FIG. 2, the process begins with an SOI wafer comprising a silicon handle wafer 101 which has a silicon dioxide sacrificial layer 103 disposed thereon. A thin semiconductor layer 105 of active single-crystalline silicon is disposed on the sacrificial layer. In some embodiments, a thin protective layer (preferably an oxide layer) may be provided on top of the semiconductor layer to prevent damage to the surface during subsequent processing, in which case this thin oxide layer may be removed before growth of the semiconductor layer to the final device thickness.

Figure 3:
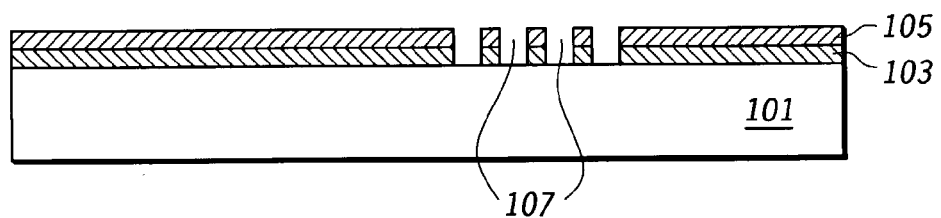

The wafer is then patterned and etched as shown in FIG. 3 to define a series of openings 107 of predetermined size which extend through the semiconductor layer 105 and the sacrificial layer 103 and expose the silicon handle wafer 101. The etching used to define the openings 107 is typically a reactive ion etch (RIE).

Figure 4:
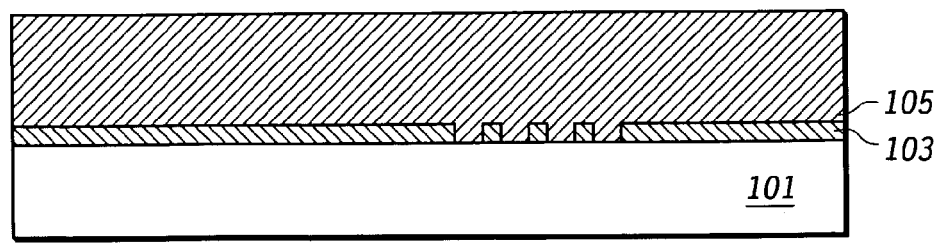

As shown in FIG. 4, the semiconductor layer 105 is then further epitaxially grown to the desired device thickness which, in many applications, is about 20 microns. During the growth process, silicon can be made to grow vertically in the openings 107 from the silicon handle wafer and to grow both vertically and laterally from the semiconductor layer 105. If the openings are of appropriate dimensions with respect to the final device thickness, the crystal growth fronts merge to form a planar surface. This surface then continues to grow with a planar topography until the full device thickness is achieved. Thus, with appropriate selection of the dimensions of the openings in the semiconductor layer, lateral overgrowth and vertical overgrowth can be made to proceed such that, at the end of epitaxy, the resulting wafer is very planar and thus well suited for lithography.

Figure 5:
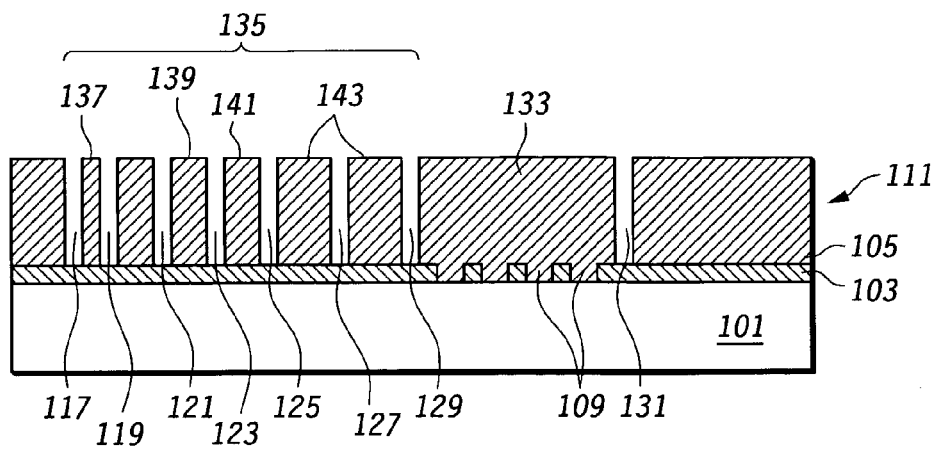

FIG. 5 depicts the completed structure prior to release. Deep RIE is used to create a series of trenches 117, 119, 121, 123, 125, 127, 129, and 131 which extend through the device layer and down to the sacrificial layer 103 and which can be used to define the anchor portion 133 and the suspended portion 135 of the device. The suspended portion of the device consists of a spring suspension 137, a fixed finger 139, a moving finger 141, and a proof mass area 143. Release of the structure may then be achieved through an etch of the sacrificial layer through the trenches to achieve the structure shown in FIG. 1. This etch may be achieved, for example, with an aqueous HF solution.

Figure 10:
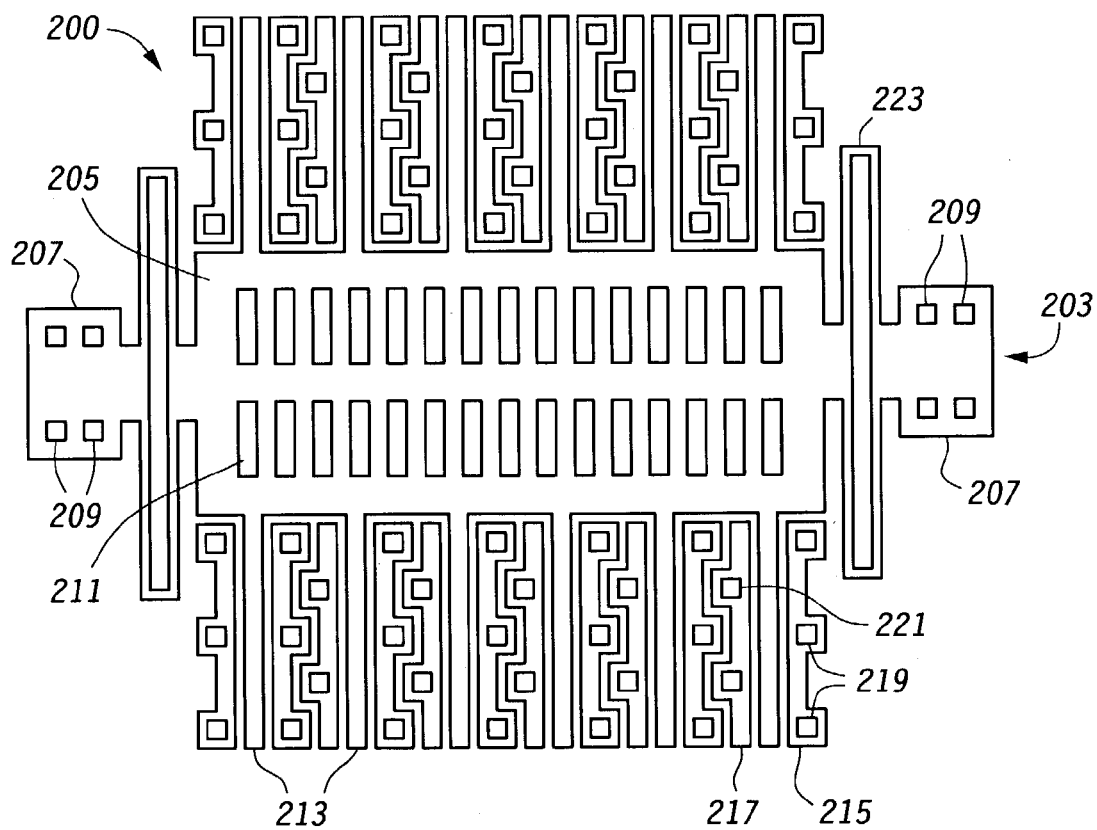
FIG. 10 is an illustration of an accelerometer that may be made using the methodology described herein.

FIG. 10 illustrates one possible design for a MEMS device (in this case, an accelerometer) that can be made using the methodology described with reference to FIGS. 2–5, it being understood that a wide variety of other designs and devices are achievable with this methodology. The device 200 has a proof mass area 203 with a suspended portion 205 and an anchored portion 207. The anchored portion is attached to a substrate (not shown) by a plurality of proof mass anchors 209. The suspended portion has a plurality of etch holes 211 therein and is equipped with a plurality of moving fingers 213. Each of the moving fingers is disposed between first 215 and second 217 fixed fingers, which are anchored by first 219 and second 221 sets of anchor fingers, respectively. A spring 223 is disposed between the suspended portion and the anchored portion of the device.

Thus far, the phenomenon of merged lateral overgrowth of epitaxial silicon has been described primarily in reference to its use in achieving a high degree of surface planarity on a wafer after electrical contact to the handle wafer has been made has been made. However, as previously noted, this phenomenon may also be used to form anti-stiction protrusions.

Figure 6:
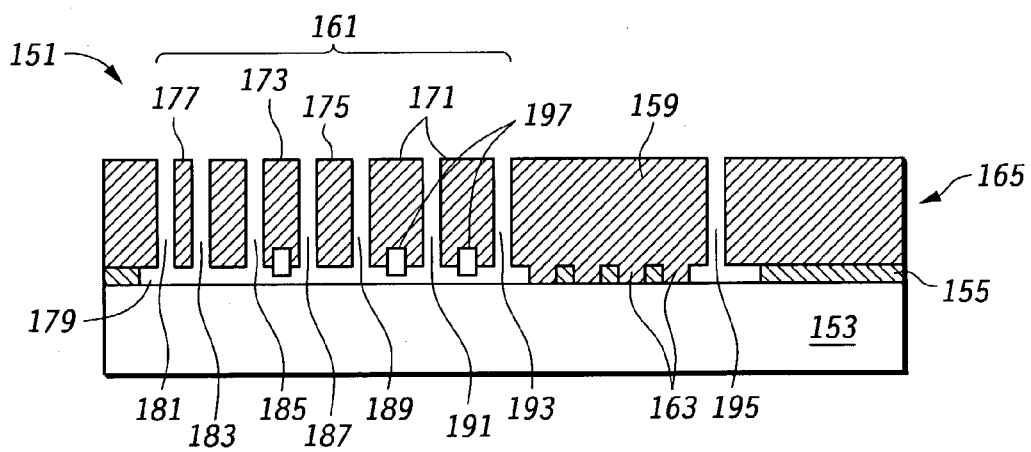
FIG. 6 is a cross-sectional illustration depicting a MEMS structure with contact to the handle wafer which is equipped with anti-stiction protrusions.

FIG. 6 illustrates one embodiment of a MEMS device 151 that can be made using merged lateral overgrowth of epitaxial silicon to form anti-stiction protrusions. The device is created on a substrate comprising a silicon handle wafer 153 and a sacrificial layer 155, and has an anchor portion 159 and a suspended portion 161. The anchor portion in the particular device depicted is equipped with a plurality of anchors 163. The device has an epitaxially grown device layer 165, and is equipped with a proof mass area 171, at least one moving finger 173, at least one fixed finger 175, and a spring suspension 177. Release of the structure is accomplished through the creation of horizontal trench 179 via vertical trenches 181, 183, 185, 187, 189, 191, 193 and 195. The device is provided with a plurality of anti-stiction protrusions 197 to prevent stiction of the moving elements of the device.

Figure 7:
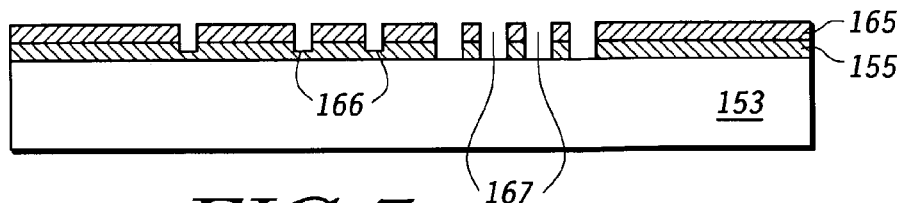
FIGS. 7–9 are cross-sectional illustrations depicting an embodiment of the methodology that may be used to fabricate the device of FIG. 6.

FIGS. 7–10 illustrate the methodology that may be used to achieve the device shown in FIG. 6. As shown in FIG. 7, the method utilizes an SOI wafer which comprises a silicon handle wafer 153, a silicon dioxide sacrificial layer 155, and a thin single crystal semiconductor layer 165. The wafer is then patterned and etched to define a first plurality of openings 167 which extend through the semiconductor layer 165 and the sacrificial layer 155 and which expose the silicon handle for handle contact. The etching used to define the first plurality of openings 167 is typically a reactive ion etch (RIE). Preferably, the ratio of the depth of the opening to final device layer thickness is within the range of about 1 to about 10, more preferably about 2 to about 5, and most preferably from about 3 to about 4. Also, the ratio of the minimum width of the opening to final device layer thickness is preferably within the range of about 0.05 to about 2, and more preferably about 0.1 to about 1.3.

A second plurality of openings 166 are also patterned and etched through the semiconductor layer and into the sacrificial layer in the areas were the anti-stiction protrusions are to be formed. Preferably, the second plurality of openings extend about 0.5 microns into the sacrificial layer. The depth of the second plurality of openings into the sacrificial layer is preferably between one third to one half of the thickness of the sacrificial layer. The depth of these openings will typically determine the height of the anti-stiction protrusions.

Figure 8:
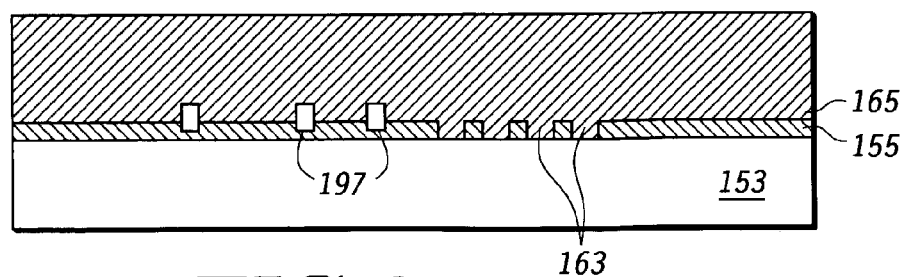

As shown in FIG. 8, the semiconductor layer 165 is then further grown to the desired device thickness (typically about 20 microns) by epitaxy. Anti-stiction protrusions 197 are formed during this process by the merged growth of epitaxial silicon (in the lateral direction from semiconductor layer 165) and epitaxial polysilicon (in the vertical direction from the bottom of openings 166). Hence, the dimensions of the second plurality of openings 166 (see FIG. 7) in the sacrificial layer determine the dimensions of the anti-stiction protrusions. In the particular embodiment illustrated, a plurality of anchors 163 are also formed during this process which are in electrical contact with the substrate. However, this is not a requirement of the methodology disclosed herein for forming anti-stiction protrusions. Thus, for example, the anchors could be formed in a separate step from the anti-stiction protrusions using conventional anchor forming techniques.

It will likewise be appreciated that the anchors may comprise a material other than epitaxial silicon. For example, the anchors may comprise silicon nitride. It will further be appreciated that, in some embodiments, this methodology may be used solely to form anti-stiction protrusions, and thus does not result in the formation of any anchor portions.

Figure 9:
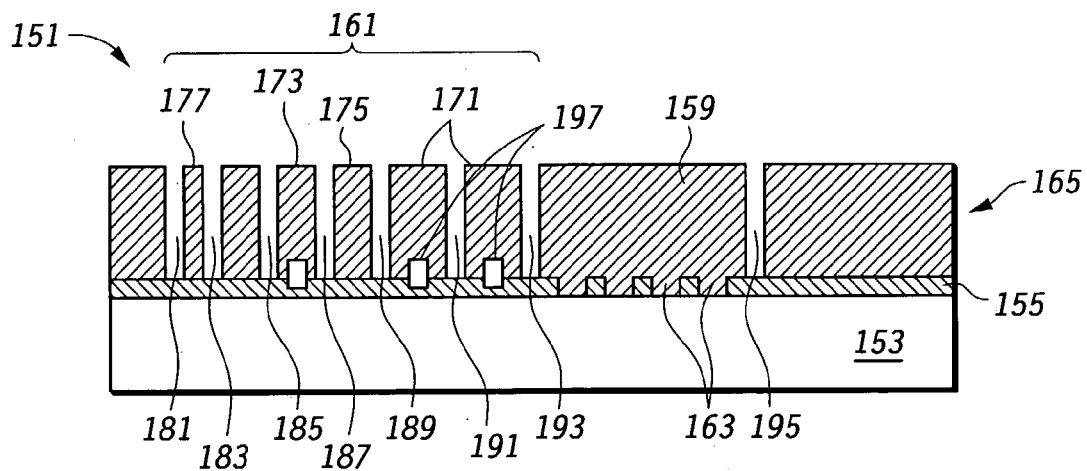

As shown in FIG. 9, the wafer is then patterned and etched, and RIE is used to define a series of trenches 181, 183, 185, 187, 189, 191, 193, and 195 which extend through the semiconductor layer 165 (the epitaxially grown semiconductor layer is referred to herein as the device layer) and down to the sacrificial layer 155. The structure is then released with a suitable etchant, such as an aqueous solution of HF.

Various etchants may be used in the methodologies described herein. The choice of etchants will depend on various factors, such as the composition of the substrate, sacrificial layer or semiconductor layer, the composition of components or features present on the article at the time of etch, and the selectivity of a prospective etch. Preferably, the etchant is an aqueous HF solution, although the etchant may also be HF with various concentrations of acetic acid. These materials may be used as aqueous or organic solvent based solutions, and the solutions may be buffered. In some applications, vapor phase HF may also be used to effect release of the semiconductor structure. A method for producing a MEMS structure on a substrate, and particularly on an SOI wafer, has been provided herein that allows for a high degree of surface planarity on the wafer after electrical contact to the handle wafer has been made. A method for producing anti-stiction protrusions in a MEMS structure that achieves a consistent device thickness has also been provided.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for creating a semiconductor structure, comprising the steps of:
   providing an article comprising a substrate and a single crystal semiconductor layer and having a sacrificial layer disposed between the substrate and the semiconductor layer;
   creating an opening which extends through the semiconductor layer and into the sacrificial layer; and
   epitaxially growing the semiconductor layer to a suitable device thickness, thereby forming a device layer;
   wherein the semiconductor layer is grown such that the resulting device layer extends over the opening, wherein the surface of the portion of the device layer extending over the opening is single crystal silicon, and wherein the step of epitaxially growing the semiconductor layer results in the formation of an anti-stiction protrusion within the device layer and the sacrificial layer.

2. The method of claim 1, wherein the device layer is grown such that the opening is filled by the material of the device layer.

3. The method of claim 1, wherein the opening extends through the sacrificial layer and exposes a portion of the substrate.

4. The method of claim 3, wherein the step of epitaxially growing the device layer results in the formation of an anchor portion which is in contact with the substrate and which extends through the sacrificial layer.

5. The method of claim 4, further comprising the steps of:
   forming a semiconductor structure in the device layer; and
   removing at least a portion of the sacrificial layer, thereby releasing the semiconductor structure.

6. The method of claim 5, wherein the step of removing at least a portion of the sacrificial layer comprises the steps of:
   creating a trench in the device layer which exposes a portion of the sacrificial layer; and
   contacting the sacrificial layer, by way of the trench, with an etchant.

7. The method of claim 5, wherein the semiconductor structure comprises an anchor area, a proof mass area, a moving finger, and a fixed finger.

8. The method of claim 1, wherein the surface of the device layer is essentially planar.

9. The method of claim 1, further comprising the step of removing a portion of the sacrificial layer.

10. The method of claim 1, wherein the ratio of the depth of the opening to the device thickness is within the range of about 1 to about 10.

11. The method of claim 1, wherein the ratio of the depth of the opening to the device thickness is within the range of about 2 to about 5.

12. The method of claim 1, wherein the ratio of the depth of the opening to the device thickness is within the range of about 3 to about 4.

13. The method of claim 1, wherein the step of epitaxially growing the semiconductor layer to a suitable device thickness involves both lateral and vertical epitaxial growth of the semiconductor layer in the opening.

14. A method for creating a semiconductor structure, comprising the steps of:
   providing an article comprising a substrate and a single crystal semiconductor layer and having a sacrificial layer disposed between the substrate and the semiconductor layer;
   creating at least one opening which extends through the semiconductor layer and into the sacrificial layer;
   epitaxially growing the semiconductor layer to form a device layer such that the material of the device layer extends into the opening and thereby forms an anchor portion which extends through the sacrificial layer;
   forming a semiconductor structure in the semiconductor layer; and
   removing at least a portion of the sacrificial layer with an etchant, thereby releasing the semiconductor structure;
   wherein the semiconductor layer is grown such that the resulting device layer extends over the opening, wherein the surface of the portion of the device layer extending over the opening is single crystal silicon, and wherein the ratio of the depth of the opening to the thickness of the device layer is within the range of about 1 to about 10.

15. The method of claim 14, wherein the etchant comprises an aqueous HF solution.

16. The method of claim 14, wherein the ratio of the depth of the opening to the thickness of the device layer is within the range of about 2 to about 5.

17. The method of claim 14, wherein the ratio of the depth of the opening to the thickness of the device layer is within the range of about 3 to about 4.

18. The method of claim 14, wherein the step of epitaxially growing the semiconductor involves both lateral and vertical epitaxial growth of the semiconductor layer in the opening.

19. The method of claim 14, wherein the released semiconductor structure is a MEMS structure.

20. A method for creating a semiconductor structure having an anti-stiction protrusion, comprising the steps of:
providing an article comprising a substrate and a semiconductor layer and having a sacrificial layer disposed between the substrate and the semiconductor layer;
creating at least one opening which extends through the semiconductor layer and partially into the sacrificial layer;
epitaxially growing the semiconductor layer to form a device layer such that the material of the device layer extends into the opening and thereby forms an anti-stiction protrusion that extends from the device layer and into the sacrificial layer;
forming a semiconductor structure in the semiconductor layer; and
removing, with an etchant, at least a portion of the sacrificial layer surrounding the protrusion.

21. The method of claim 20, wherein the semiconductor layer is grown such that the resulting device layer extends over the opening, and wherein the surface of the portion of the device layer extending over the opening comprises single crystal silicon.

22. The method of claim 20, wherein the ratio of the depth of the opening to the thickness of the device layer is within the range of about 1 to about 10.

23. The method of claim 20, wherein the ratio of the depth of the opening to the thickness of the device layer is within the range of about 2 to about 5.

24. The method of claim 20, wherein the ratio of the depth of the opening to the thickness of the device layer is within the range of about 3 to about 4.

25. The method of claim 20, wherein the step of epitaxially growing the semiconductor layer involves both lateral and vertical epitaxial growth of the semiconductor layer in the opening.

26. The method of claim 20, wherein the semiconductor structure is a MEMS structure.

27. The method of claim 1, wherein the opening extends through the sacrificial layer.

28. The method of claim 14, wherein the opening extends through the semiconductor layer and the sacrificial layer and exposes a portion of the substrate, and wherein the device layer forms an anchor portion which is in contact with the substrate and which extends through the sacrificial layer.

* * * * *